United States Patent [19]

Kagawa et al.

[11] Patent Number: 4,852,112
[45] Date of Patent: Jul. 25, 1989

[54] SEMICONDUCTOR LASER WITH FACET PROTECTION FILM OF SELECTED REFLECTIVITY

[75] Inventors: Hitoshi Kagawa; Ryo Hattori, both of Itami, Japan

[73] Assignee: Mitsubishi Denki Kabushiki Kaisha, Japan

[21] Appl. No.: 175,278

[22] Filed: Mar. 30, 1988

[30] Foreign Application Priority Data

Mar. 31, 1987 [JP] Japan ................................. 62-79934

[51] Int. Cl.[4] .............................................. H01S 3/19
[52] U.S. Cl. ..................................................... 372/49
[58] Field of Search ............................. 372/49, 29, 32

[56] References Cited

U.S. PATENT DOCUMENTS 4,178,564 12/1979 Ladany et al. ......................... 372/49

OTHER PUBLICATIONS

Born et al, "Principles of Optics", Pergamon Press, Third Revised Edition, 1965, pp. 55–70.
Hammer, "Closed Form Theory of Multicavity Reflectors and the Output Power of External Cavity Diode Lasers", IEEE, 1984, pp. 1252–1258.

Primary Examiner—James W. Davie
Attorney, Agent, or Firm—Leydig, Voit & Mayer

[57] ABSTRACT

A semiconductor laser includes a facet protection film consisting of an $Al_2O_3$ film of optical length $\lambda/4$ and a $SiO_2$ film of optical length $\lambda/4$ produced on the $Al_2O_3$ film, and the facet reflectivity takes a value with in $21\pm3\%$.

3 Claims, 2 Drawing Sheets

F I G. 4.
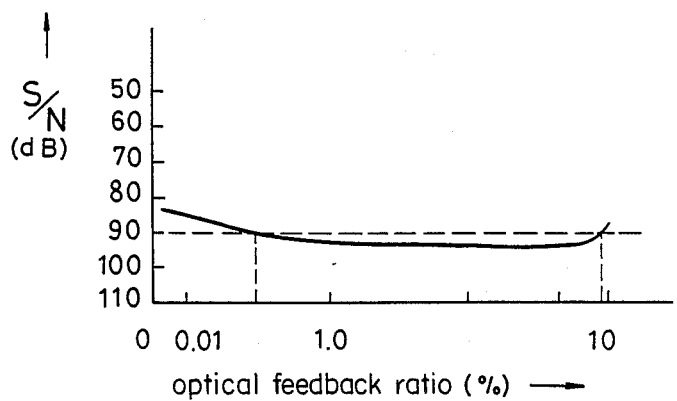

SEMICONDUCTOR LASER WITH FACET PROTECTION FILM OF SELECTED REFLECTIVITY

FIELD OF THE INVENTION

The present invention relates to a semiconductor laser, and more particularly to that capable of being applied in an optical disc system.

BACKGROUND OF THE INVENTION

In a semiconductor laser which is applied as an optical disc system, noise induced by optical feedback from recording material to the laser facet causes a problem. Accordingly, in order to obtain a stable S/N (signal-to-noise ratio), it is proposed to control the front facet reflectivity of a semiconductor laser to have a value within 21±3%. FIG. 4 shows typical characteristics of S/N versus optical feedback ratio in a case where the front facet reflectivity is 20%.

FIG. 5 shows characteristics of the facet reflectivity versus film thickness in a case where a single layer film of $Al_2O_3$ is used for facet protection film as is generally used. As is apparent from FIG. 5, it is required to control the film thickness to achieve the desired reflectivity. In order to make the facet reflectivity within 21±3%, the optical thickness of the $Al_2O_3$ layer must lie in one of two ranges marked a in FIG. 5 that lie on opposite sides of the quarter wavelength optical thickness which is at the center of of FIG. 5.

In the prior art semiconductor laser having a facet protection film of such a construction, the facet reflectivity of 21±3% is realized only by controlling the thickness of the single layer film of $Al_2O_3$. However, since any variation in the facet reflectivity which occurs is largely dependent on film thickness, as is apparent from FIG. 5, a facet reflectivity of 21±3% cannot be obtained due to the variations produced in film thickness during deposition of the film.

SUMMARY OF THE INVENTION

An object of the present invention is to provide a semiconductor laser having a facet protection film, capable of realizing a facet reflectivity of 21±3% easily and stably.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

According to a semiconductor laser of the present invention, a facet protection film is constructed of a $Al_2O_3$ film of optical length $\lambda/4$ and a $SiO_2$ film of optical length $\lambda/4$ produced on the $Al_2O_3$ film, and the facet reflectivity has a value within 21±3%.

BRIEF DESCRIPTION OF THE DRAWINGS

FIG. 4 is a diagram showing the characteristics of S/N versus optical feedback ratio.

DETAILED DESCRIPTION OF THE PREFERRED EMBODIMENTS

An embodiment of the present invention will be described in detail with reference to the drawings.

Figure 1:
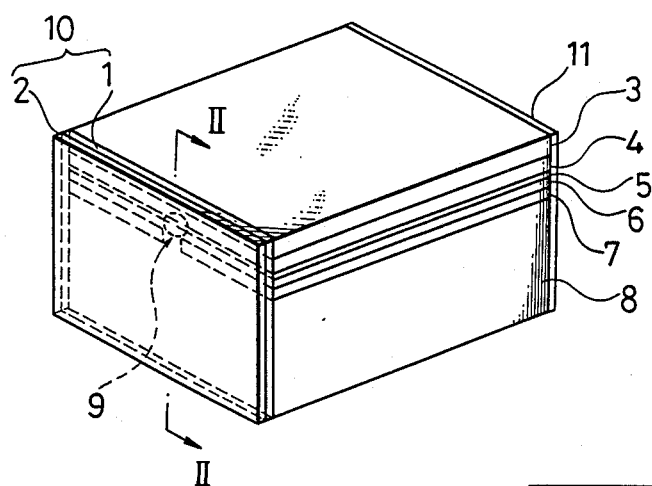
FIG. 1 is a perspective view showing a semiconductor laser as an embodiment of the present invention.
Figure 2:
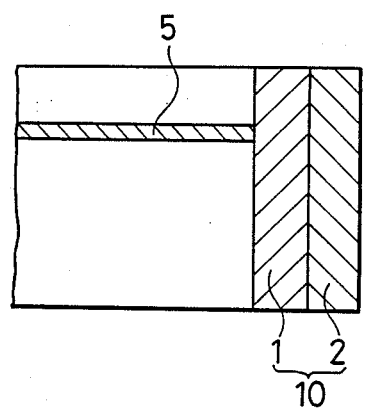
FIG. 2 is a cross-sectional view of the semiconductor laser of FIG. 1.

FIG. 1 shows a construction of a semiconductor laser as an embodiment of the present invention and FIG. 2 shows a cross-section thereof taken along lines II—II. In FIGS. 1 and 2, the reference numeral 8 designates a semiconductor substrate. A current blocking layer 7 is produced on the semiconductor substrate 8. A second cladding layer 6 is produced on the current blocking layer 7. An active layer 5 is produced on the second cladding layer 6 and a first cladding layer 4 is produced on the active layer 5. A contact layer 3 is produced on the first cladding layer 4. An $Al_2O_3$ film 1 of optical length $\lambda/4$ is disposed on the front facet which may be produced by by cleaving. An $SiO_2$ film 2 of optical length $\lambda/4$ is produced on the $Al_2O_3$ film 1. These two films 1 and 2 constitute a facet protection film 10. A facet protection film 11 is produced on the rear facet. This rear facet protection film 11 is produced to have a desired reflectivity oriented to its use. The reference numeral 9 designates a light emission region which is produced at the central region of the active layer 5. Although not shown in the drawings, a p side and an n side electrode are provided on the contact layer 3 and the substrate 8, respectively.

The device will be operated as follows.

When a voltage is applied across the p and n electrodes, a current flows into the active layer 5 that is confined in a stripe configuration by the current blocking layer 7. Then, light emitting recombination of electrons and holes occur at the central portion of the active layer 5, and the generated light is reflected within the laser resonator thereby causing laser oscillation. The laser light is emitted from both the front and rear facets through the respective facet protection films 10 and 11. The light emitted from the front facet is used as an output light and the light emitted from the rear facet is used as a monitor light.

In this semiconductor laser, the facet protection film 10 produced at the front facet of the semiconductor laser consists of an $Al_2O_3$ film 1 and a $SiO_2$ film 2. The film thicknesses of both $Al_2O_3$ and $SiO_2$ films 1 and 2 are established such that the optical length $l = n \cdot d$ is equal to $\lambda/4$ (n represents refractive index and d represents film thickness).

Figure 3:
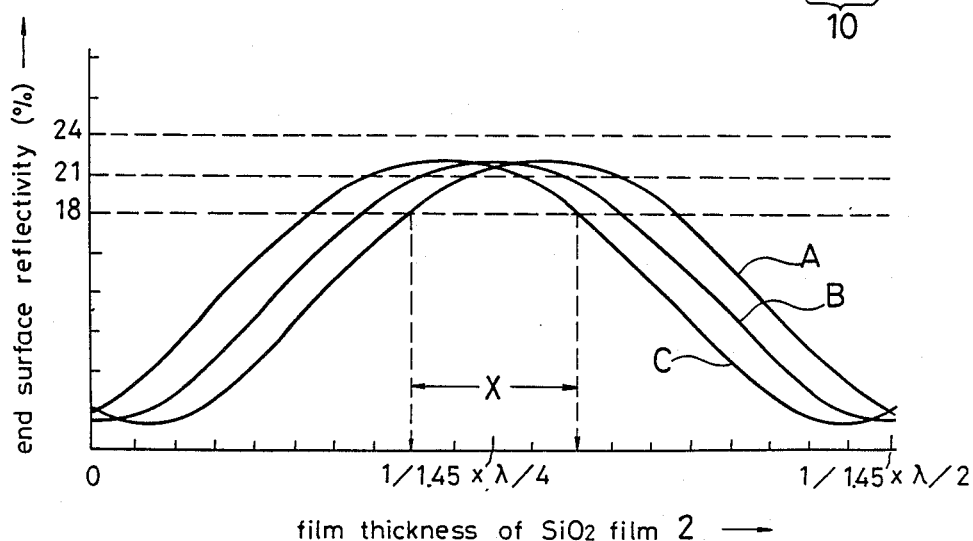
FIG. 3 is a diagram showing facet reflectivity versus film thickness of the facet protection of the laser of FIG. 1.
Figure 5:
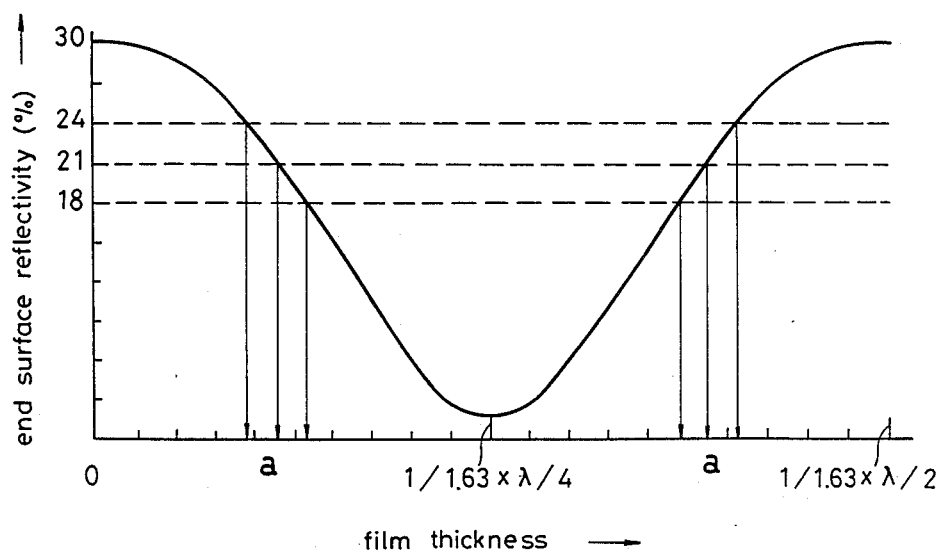
FIG. 5 is a diagram showing facet reflectivity versus film thickness of a prior art laser.

FIG. 3 shows the relationship between the facet reflectivity and the film thickness of the $SiO_2$ film 2 constituting the facet protection film 10. In this figure, curve A corresponds to a case where the optical length of $Al_2O_3$ film 1 has a value less than $\lambda/4$ by about 10%, curve B corresponds to a case where the optical length of $Al_2O_3$ film 1 has a value of $\lambda/4$, and curve C corresponds to a case where the optical length of $Al_2O_3$ film 1 has a value greater than $\lambda/4$ by about 10%.

Herein, the refractive index $n_1$ of the $Al_2O_3$ film 1 is set at 1.63, that $n_2$ of the $SiO_2$ film is set at 1.45, and that $n_0$ of the active layer 5 is set at 3.50. As is known in the art, these refractive indices for $Al_2O_3$ are for the spectral wavelength range from about 500 nanometers (nm) to about 800 nm.

As is apparent from FIG. 3, the peaks having small widths of the reflectivity curves A, B, and C exist within the range of 21%±3%, reflectivity. Even when the film thickness of the Al$_2$O$_3$ film 1 of the facet reflection film 10 is varied in a range of about ±10% from λ/4, the range of film thicknesses of the SiO$_2$ film 2 capable producing a facet reflectivity of 21±3% is more than ±20% from 1/1.45×λ/4.

Accordingly, when the film thickness of the SiO$_2$ film 2 is established at a value within a range of ±20% from 1/1.45×λ/4 as shown by X of FIG. 3, the facet reflectivity surely falls in the range of 21%±3% even when variation occurs in the film thickness of Al$_2$O$_3$ film 1 within a range of about ±10%, and a facet reflectivity of 21%±3% can be easily obtained. Therefore, the semiconductor laser of the present invention exhibits stable S/N characteristics.

As is evident from the foregoing description, according to the present invention, a facet protection film consisting of an Al$_2$O$_3$ film of λ/4 optical length and a SiO$_2$ film of λ/4 optical length is provided at a laser facet thereby making the facet reflectivity have a value within 21±3%. Accordingly, the optimum value of facet reflectivity, that is, 21±3% can be obtained easily and stably. Thus, a semiconductor laser conducting a stable laser oscillation is obtained.

What is claimed is:

1. A semiconductor laser comprising:
   a facet protection film consisting of an Al$_2$O$_3$ film of optical length λ/4 and an SiO$_2$ film of optical length λ/4 disposed on said Al$_2$O$_3$ film producing a facet reflectivity of twenty-one percent plus or minus three percent.

2. A semiconductor laser comprising:
   a facet protection film comprising an Al$_2$O$_3$ film of optical length λ/4 and an SiO$_2$ film of optical length λ/4 disposed on said Al$_2$O$_3$ film producing a facet reflectivity of twenty-one percent plus or minus three percent.

3. A semiconductor laser comprising a body of semiconductor material having at least one facet through which coherent radiation produced in the body of the semiconductor material and having a particular wavelength may be emitted wherein said facet is coated with a facet protection film giving said facet a reflectivity at said wavelength of twenty-one percent plus or minus three percent, said protection film comprising an Al$_2$O$_3$ film having an optical thickness through which said coherent radiation may pass approximating one-quarter of said wavelength plus or minus about ten percent and an SiO$_2$ film disposed in contact with said Al$_2$O$_3$ film and having an optical thickness through which said coherent radiation may pass approximating one-quarter of said wavelength plus or minus about twenty percent.

* * * * *